United States Patent
Nagarandal (10) Patent No.: US 7,539,957 B1
(45) Date of Patent: May 26, 2009

(54) AUTOMATIC TEST PATTERN GENERATION TOOL WITH FEEDBACK PATH CAPABILITIES FOR TESTING CIRCUITS WITH REPEATING BLOCKS

(75) Inventor: Ajay Nagarandal, San Jose, CA (US)

(73) Assignee: Altera Corporation, San Jose, CA (US)

( * ) Notice: Subject to any disclaimer, the term of this patent is extended or adjusted under 35 U.S.C. 154(b) by 384 days.

(21) Appl. No.: 11/139,165

(22) Filed: May 26, 2005

(51) Int. Cl.
*G06F 17/50* (2006.01)
*G01R 31/28* (2006.01)

(52) U.S. Cl. .............. 716/4; 716/1; 716/5; 716/6; 716/12; 716/18; 714/726

(58) Field of Classification Search ............ 716/1, 716/4–6, 12, 18; 714/726
See application file for complete search history.

(56) References Cited

U.S. PATENT DOCUMENTS

| | | | |
|---|---|---|---|
| 5,572,717 A | 11/1996 | Pedersen | |
| 5,608,337 A | 3/1997 | Hendricks et al. | |
| 6,067,650 A * | 5/2000 | Beausang et al. | 714/726 |
| 6,112,020 A | 8/2000 | Wright | |
| 6,167,364 A | 12/2000 | Stellenberg et al. | |
| 6,195,772 B1 | 2/2001 | Mielke et al. | |
| 6,308,299 B1 * | 10/2001 | Burch et al. | 716/4 |
| 6,345,379 B1 * | 2/2002 | Khouja et al. | 716/4 |
| 6,405,347 B1 * | 6/2002 | McBride | 716/4 |
| 6,421,818 B1 * | 7/2002 | Dupenloup et al. | 716/18 |
| 6,530,073 B2 * | 3/2003 | Morgan | 716/18 |
| 6,539,536 B1 * | 3/2003 | Singh et al. | 716/18 |
| 6,725,432 B2 * | 4/2004 | Chang et al. | 716/4 |
| 6,735,743 B1 * | 5/2004 | McElvain | 716/4 |
| 6,968,514 B2 * | 11/2005 | Cooke et al. | 716/1 |
| 6,990,643 B1 * | 1/2006 | McBride | 716/5 |
| 7,073,141 B2 * | 7/2006 | Novakovsky et al. | 716/4 |
| 7,080,333 B1 * | 7/2006 | Ratchev et al. | 716/5 |
| 7,096,436 B2 * | 8/2006 | Bednar et al. | 716/1 |
| 7,210,109 B2 * | 4/2007 | Caron et al. | 716/4 |
| 7,216,317 B2 * | 5/2007 | Sripada | 716/6 |

OTHER PUBLICATIONS

"FastScan and the ATPG Product Family," Datasheet of Mentor Graphics (2003).
"TeraMAX ATPG," Datasheet of Synopsys, Inc. (May 1999).

* cited by examiner

*Primary Examiner*—Helen Rossoshek
(74) *Attorney, Agent, or Firm*—Treyz Law Group; G. Victor Treyz; David C. Kellogg (57) ABSTRACT

Methods and apparatus for testing integrated circuits are provided. Integrated circuits sometimes contain repeating blocks of identical circuitry. Each identical circuit block contains scan chain registers that can be used to support testing. Each circuit block also has associated inputs and outputs. The inputs and outputs of the circuit blocks serve to interconnect each block to its neighboring blocks. An integrated circuit to be tested is described by a circuit netlist. The circuit netlist is processed to identify identical netlist modules. The repeating netlist modules correspond to the identical circuit blocks on the integrated circuit. By processing a given instance of a repeating netlist module, block-level test data can be generated. Global test data suitable for testing the entire integrated circuit can be generated from the block-level test data.

13 Claims, 12 Drawing Sheets

FIG. 1

| A | B | X |
|---|---|---|
| 0 | 1 | 0 |
| 1 | 0 | 0 |
| 1 | 1 | 1 |

```
MODULE MYCKT    PORT DEFINITIONS  ~76
         INPUT AND OUTPUT DEFINITIONS  ~78
   80            84           ┌─82
     ↘ MULT SF A1 (.IN1)(I1), .IN2 (I2), .OUT1 (W1), .OUT2 (W2));
       MULT SF A2 (.IN1 (W1), .IN2 (W2), .OUT1 (X1), .OUT2 (X2));
       MULT SF A3 (.IN1 (X1), .IN (X2), .OUT1 (01), .OUT2 (02));

END MODULE

MODULE MULT SF (IN1, IN2, OUT1, OUT2)
         INPUT AND OUTPUT DEFINITIONS  ~88

┌ OR (Y1, IN1, IN2);
          │ SCANFF F1 (Y2, IN1, CLK);
       90 ┤ SCANFF F2 (Y3, Y1, CLK);
          │ AND (OUT2, Y2, Y3);
          └ BUF (OUT1, Y2);

END MODULE
```

AUTOMATIC TEST PATTERN GENERATION TOOL WITH FEEDBACK PATH CAPABILITIES FOR TESTING CIRCUITS WITH REPEATING BLOCKS

BACKGROUND

This invention relates to testing integrated circuits, and more particularly, to testing integrated circuits that contain blocks of identical circuitry.

Modern integrated circuits require testing to verify that they are properly performing their intended functions. A logic circuit may be tested by observing its response to test vectors. If the observed response matches the expected response, the circuit passes the test.

Testing tools called automatic test pattern generation (ATPG) tools are used to generate the test data needed to thoroughly test a circuit. Completely exhaustive testing, while theoretically possible, is typically not efficient or warranted. Rather, an ATPG tool attempts to generate a meaningful set of test data that will exercise the relevant features of the circuit under test. In a typical scenario, an ATPG tool is provided with a netlist describing a given integrated circuit. The ATPG tool processes the netlist and generates a corresponding set of test data. The test data is applied to the circuit under test using a tester. The tester evaluates the resulting output of the circuit to determine whether the circuit is performing properly.

If a circuit is large and complicated, the ATPG tool may crash (if sufficient computer memory is not available) or may take an undesirably long time to complete the test data generation process.

It would therefore be desirable to be able to provide ways in which to improve automatic test pattern generation processing of integrated circuit netlists to produce test data.

BRIEF SUMMARY

Systems and methods are provided to efficiently test integrated circuits that contain multiple identical blocks of circuitry.

An integrated circuit to be tested is represented by a circuit netlist. The circuit netlist describes the circuit components and interconnections in the circuitry of the integrated circuit device.

The circuit netlist is typically written in a hardware description language (HDL) such as Verilog. The circuit netlist is an HDL module. When the integrated circuit to be tested contains a number of identical circuit blocks, the HDL module of the circuit netlist contains multiple instances of a netlist module for the identical circuit block.

Test data can be produced efficiently by identifying the repeating netlist module and using that module to generate block-level test data. In generating the block-level test data, the connectivity of the repeating module is changed, so that the outputs of the module are connected to its inputs to form a feedback path. Rearranging the connectivity of the module in this way ensures that the appropriate circuitry is covered by the resulting block-level test data that is produced.

The block-level test data is suitable for testing the circuitry of its corresponding circuit block. To generate test data suitable for testing the entire integrated circuit described by the circuit netlist, the block-level test data is aggregated by an aggregation tool.

Testmode registers can be added to integrated circuits whose identical circuit blocks contain an unregistered (combinatorial) path between a given input and a given output.

Further features of the invention, its nature and various advantages will be more apparent from the accompanying drawings and the following detailed description of the preferred embodiments.

DETAILED DESCRIPTION

The present invention relates to software-based systems for automatically generating test data for testing integrated circuits that contain a number of identical circuit blocks and to methods for using such systems.

Modern digital integrated circuits often contain hundreds of thousands or millions of logic gates. Testing the logic of these circuits is a complex undertaking and requires the use of computer-based testing tools. In a typical scenario, a logic designer designs an integrated circuit using computer-aided design (CAD) tools. The CAD tools are used to produce a netlist description of the integrated circuit.

The netlist is used as the circuit "blueprint" when implementing the circuit in silicon (e.g., when generating mask sets for fabricating the integrated circuit, when generating configuration data for programming a programmable logic device, etc.).

The information contained in the netlist can also be used to produce test data for testing the finished integrated circuit. With one conventional arrangement, a tool called an automatic test pattern generation (ATPG) tool uses the netlist to generate a set of optimal test vectors for testing the integrated circuit. The integrated circuit can be tested thoroughly by applying the test vectors with a tester and measuring the corresponding output signals.

Figure 1:
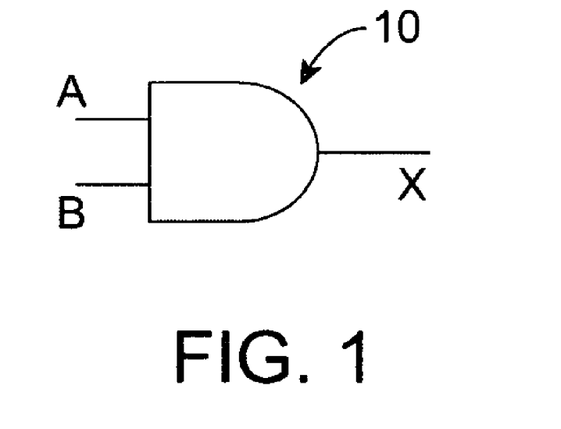
FIG. 1 is a diagram of a logic AND gate.
Figure 2:
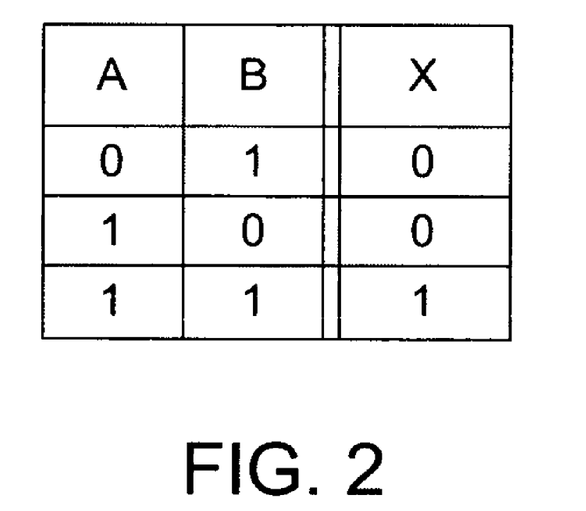
FIG. 2 is a diagram of illustrative ATPG test data that may be used to test the logic AND gate of FIG. 1.

As an example, consider the AND gate 10 of FIG. 1. An ATPG tool that processes a netlist description of the gate 10 of FIG. 1 might produce test data of the type shown in FIG. 2. The illustrative test data shown in the table of FIG. 2, contains three rows. Each row corresponds to a different test vector. In the first row, A is a logic low ("0") and B is a logic high ("1"). The expected corresponding output signal X has a logic low value. In the second and third rows, different combinations of A, B, and X are shown. By applying the A and B test inputs of FIG. 2 to gate 10 and comparing the resulting output X to the computed output of FIG. 2, a testing tool can determine whether the gate 10 of FIG. 1 is performing properly. In general, it is not necessary to test all possible combinations of inputs A and B. For example, the input scenario of A=0 and B=0 is not tested, because the other test data in FIG. 2 is sufficient to exercise the logic of gate 10 thoroughly.

Although conventional ATPG tools are available that can automatically process a circuit's netlist to produce corresponding test data for testing the circuit, difficulties arise for complex circuits. Complex circuit netlists can take undesirably long amounts of processing time to process or can cause the ATPG tool to crash (if sufficient computer memory is not available).

As a result, large numbers of additional registers called boundary scan registers are inserted into conventional integrated circuits. As shown in the conventional integrated circuit 12 of FIG. 3, for example, circuit blocks 14 have been provided with surrounding boundary scan registers 16. During testing, the boundary scan registers 16 that are attached to circuit block inputs can be loaded with test vectors. The boundary scan registers 16 that are attached to circuit block outputs can be used to capture resulting test outputs.

Figure 3:
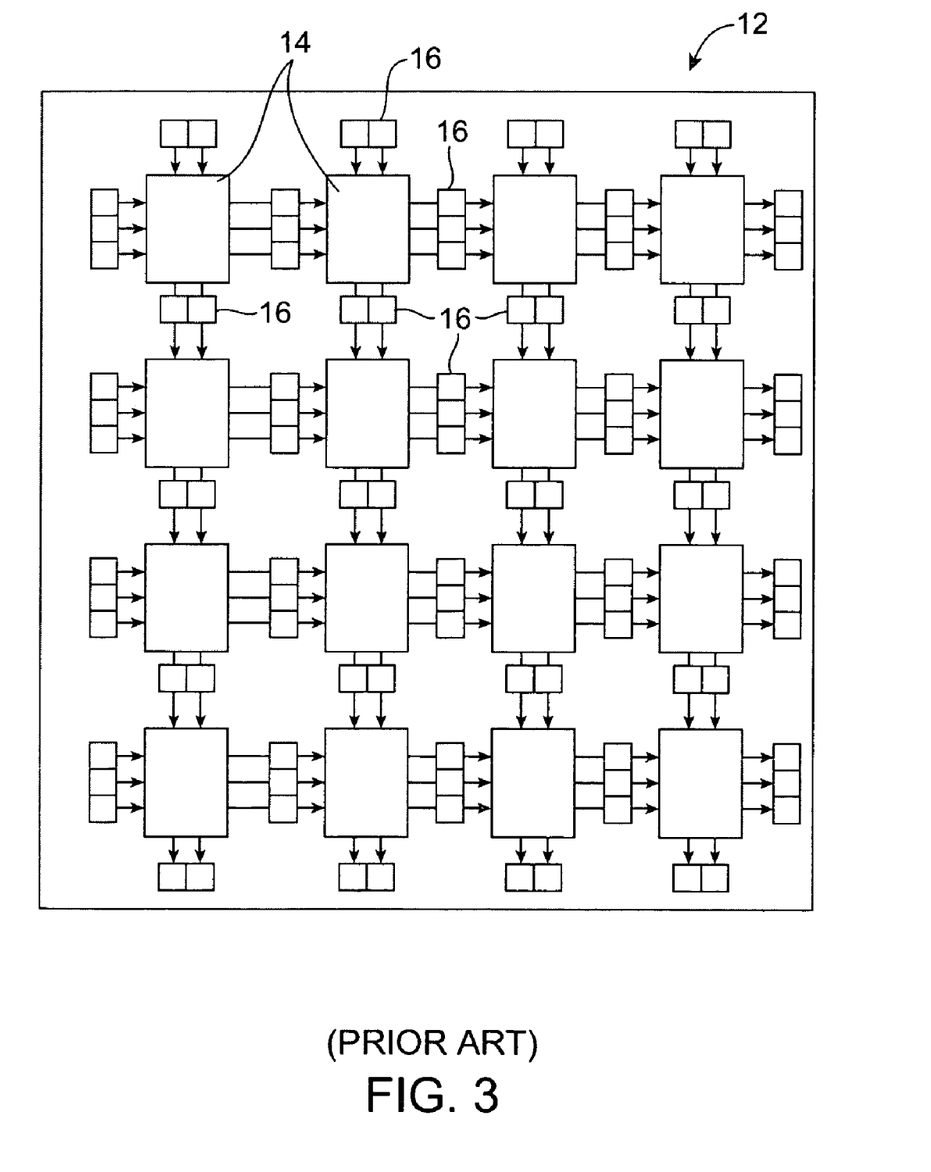
FIG. 3 is a diagram of a conventional integrated circuit in which boundary registers have been provided around each block of the circuit to facilitate testing.

The arrangement of FIG. 3 can be used to divide a large circuit 12 into many manageable smaller pieces. A conventional ATPG tool can process the netlists for circuit blocks 14 without undue difficulty, because each circuit block 14 is much smaller than the entire circuit 12.

This conventional approach requires that a potentially large number of additional boundary scan registers be added to the integrated circuit. Because these registers are only used for testing, they represent a source of overhead. If too many boundary scan registers are included, the boundary scan registers will consume too many circuit resources and will adversely affect circuit performance.

In accordance with the present invention, an ATPG tool and/or associated tools (sometimes referred to collectively herein as the ATPG tool) may be used to efficiently generate test data for large integrated circuits without requiring the use of as many boundary scan registers as conventional arrangements. The ATPG tool of the invention processes circuit netlists more efficiently by exploiting the presence of repeating circuit blocks. In the netlist description of a circuit, these functional circuit blocks are represented as portions of netlist code called modules and are therefore sometimes referred to as circuit modules.

After identifying repeating circuit blocks, the ATPG tool (or a preprocessing tool associated with the ATPG tool) automatically modifies the connectivity of a representative module so that its outputs feed back to its inputs. This modified module can then be processed by the ATPG tool to produce corresponding block-level test data.

The block-level test data can then be aggregated to produce test data for the entire chip to be tested.

This test generation methodology exploits the presence of scan chain registers in the circuit blocks and does not require the addition of large numbers of boundary scan registers to the hardware of the integrated circuit to support testing. With this approach, a circuit to be tested might only need to be provided with boundary scan registers around its periphery, rather than boundary scan registers encircling individual circuit blocks as shown in FIG. 3.

Figure 4:
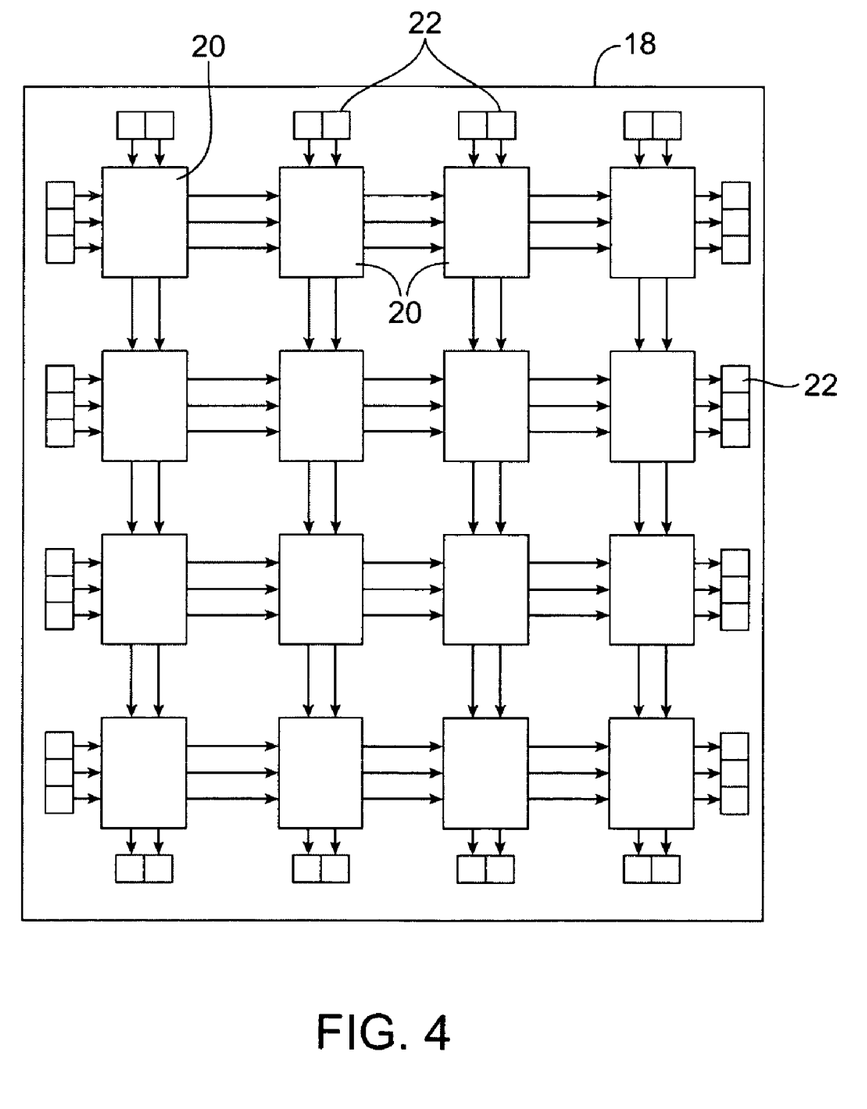
FIG. 4 is a diagram of an integrated circuit in accordance with the present invention in which boundary registers are used at the periphery of the integrated circuit.

An example of this type of arrangement is shown in FIG. 4. In the example of FIG. 4, circuit 18 has been provided with boundary scan registers 22 surrounding multiple circuit blocks 20 to facilitate testing. Test data to be applied to the circuit's inputs are loaded into the boundary scan registers 22 along the upper and left edges of circuit 18. Resulting output signals are captured at the outputs of the circuit along the right and lower edges of circuit 18.

In the example of FIG. 4, the circuitry to be tested has a number of repeating circuit blocks 20. In general, the circuitry to be tested can also include non-repeating blocks, although these non-repeating blocks are not shown in FIG. 4 to avoid over-complicating the drawing. The boundary scan registers 22 need not, in general, be used. For example, test data can be applied to some or all of the circuitry 20 directly from the pins of the integrated circuit chip 18. Resulting output signals from the circuitry under test can also be monitored using pins rather than or in addition to using boundary scan registers. Boundary scan register arrangements of the type shown in FIG. 4 can be useful when it is desired to apply test signals to digital circuitry that is surrounded by analog circuitry that is not to be tested (e.g., I/O buffers, power supply circuitry, etc.).

Any suitable type of integrated circuit may be tested using the ATPG arrangement of the present invention. For example, integrated circuits such as digital signal processors, application specific integrated circuits, custom logic circuits, programmable logic devices, and other circuits containing repeating circuit blocks may be tested. The test data used to test an integrated circuit includes the test vectors that are to be applied to appropriate test points in the circuit and the expected results of the test. When the device under test is a programmable logic device, the test data also includes test configuration data. During testing, the test configuration data is loaded into the programmable logic device under test to configure the device to perform a desired custom logic function. After the device has been configured by loading the test configuration data, the test vectors may be applied to the device and the results monitored. This process may be repeated with multiple sets of test configuration data. Integrated circuits other than programmable logic devices need not be programmed with configuration data prior to testing unless they contain regions of programmable logic.

Figure 5:
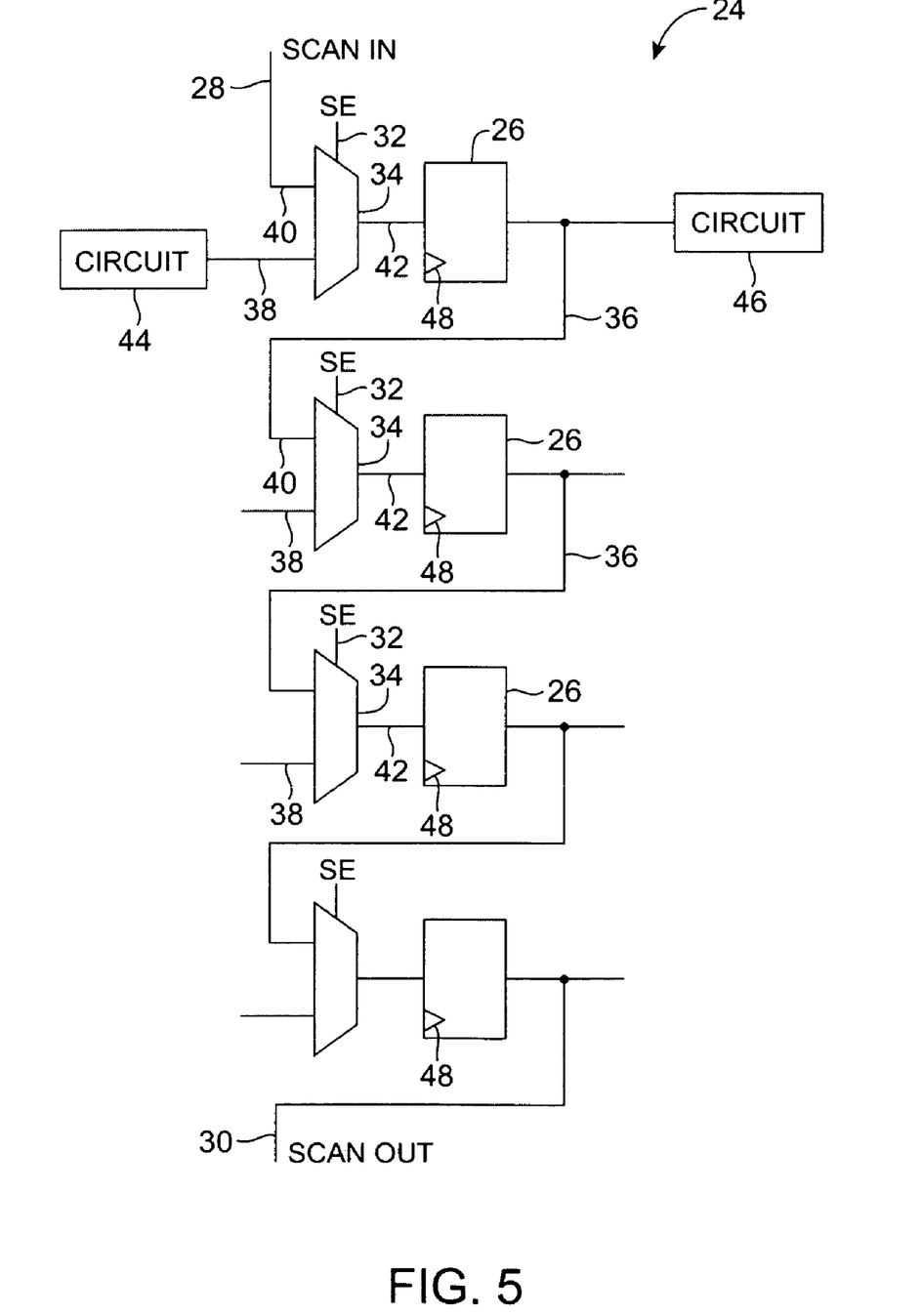
FIG. 5 is a diagram of an illustrative scan chain that may be used in testing integrated circuits in accordance with the present invention.

Modern logic circuits typically include scan chain registers other than boundary scan registers. These scan chains run through the circuitry of the device and are used to facilitate testing. A typical scan chain is shown in FIG. 5. The illustrative scan chain 24 of FIG. 5 contains four registers 26. This is merely an example. A scan chain may contain any suitable number of registers (e.g., hundreds or thousands or registers).

During normal operation of the integrated circuit, signals pass through the scan chain registers. In this mode, the registers perform their normal intended function and serve to register the signals passing through them. As an example, a signal may exit circuit 44, pass through the register 26 shown at the top of FIG. 5, and be received at circuit 46. Each register 26 has a clock input 48 that receives a clock signal for controlling the timing of the register. The circuitry that feeds the other registers 26 and that accepts the signals from the other registers 26 is not shown in FIG. 5 to avoid over-complicating the drawing.

The scan chain is formed by providing a scan chain path 36 that connects each register output to the input of the next register in the chain. Each register 26 has an associated multiplexer 34. Each multiplexer 34 has two inputs (38 and 40) and an output 42. The input 40 of each multiplexer receives scan chain data and is used to form the scan chain. The input 38 of each multiplexer is used during normal operation. For example, the input 38 of the uppermost multiplexer 34 in FIG. 5 is used to convey data from circuit 44 to register 26 and circuit 46.

Multiplexers 34 are controlled by respective scan enable (SE) control lines 32. When the scan enable signal has one state (e.g., a logic low signal), multiplexers 34 are directed to connect their inputs 38 to their outputs 42 so that the integrated circuit can perform its normal operations. When the scan enable signal has another state (e.g., a logic high signal), the scan chain registers are placed in scan mode. In this mode, the multiplexers 34 are directed to connect their scan chain inputs 40 to their respective outputs 42. This isolates the circuitry such as circuits 44 and 46 from the scan chain and allows scan chain data to flow along the scan chain from scan chain input 28 to scan chain output 30.

To perform a test, test data is serially loaded into the scan chain registers via scan in input line 28. Data that has been captured in the scan chain registers from circuits such as circuit 44 as part of a test can be unloaded from the registers through scan out line 30. During loading and unloading operations, each clock cycle results in a progressive movement of data through the scan chain by one bit position. For example, if it is desired to load three bits of test data into a scan chain through scan input 28, three clock cycles are used.

Scan chains such as scan chain 24 of FIG. 5 are present in most complex modern integrated circuits and are used to facilitate the application of test data to appropriate circuit locations to perform a test and to facilitate the capturing of the resulting logic signals from the circuitry being tested. The scan chains in a typical integrated circuit are not confined to the boundaries of the circuit's functional blocks in the way that boundary scan registers of FIG. 3 surround blocks 14.

Figure 6:
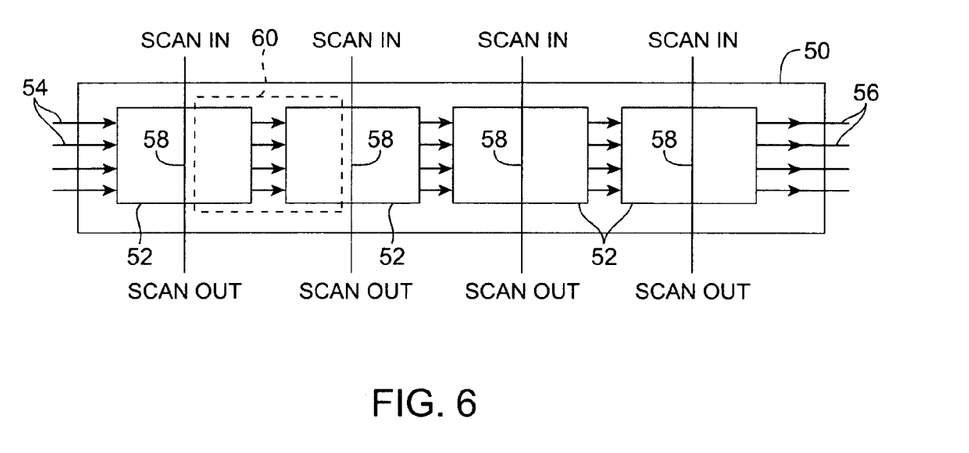
FIG. 6 is a diagram of an illustrative integrated circuit with scan chains that may be tested in accordance with the present invention.

A typical arrangement is shown in FIG. 6. In the example of FIG. 6, integrated circuit 50 contains four identical circuit blocks 52 traversed by four respective scan chains 58. Circuit 50 receives input data at inputs 54 and provides corresponding output data at outputs 56. Input-output lines connect each circuit block 52 to its neighbors. Digital signal processors, programmable logic devices, and other integrated circuits often use this type of cascaded architecture in their designs.

Each circuit block 52 performs an identical function on the signals applied to its inputs and conveys these results to its outputs. Despite the commonality between blocks 52, with conventional ATPG tools it is necessary to process the netlist of circuit 50 as a unified whole, because no boundary scan registers are available surrounding each block 52.

With the present invention, the ATPG tool modifies the netlist description for an instance of block 52 so that its outputs are fed back to its inputs. Using this rearrangement of the netlist for block 52, the ATPG tool can process netlist data that effectively covers the area within dotted line box 60. As shown in FIG. 6, box 60 spans the circuitry between respective scan chains 58. Accordingly, the scan chain registers can be used to load test data as inputs to test the circuitry corresponding to box 60 and can be used to receive resulting output signals from the circuitry in box 60. By performing suitable aggregation operations, multiple copies of the test data that is appropriate for one box 60 can be concatenated or otherwise combined to form a set of test data suitable for testing the entire circuit 50.

Each circuit block 52 in the example of FIG. 6 has a left portion that lies to the left of its scan chain and a right portion that lies to the right of its scan chain. The union of the left and right portions contains all of the circuitry of a given block 52. The circuitry contained in box 60 includes the right hand portion of the first (leftmost) block 52 and the left hand portion of the following (second from the left) block 52. This is the same circuitry that is contained in each block (i.e., one left portion and one right portion). Accordingly, the netlist covering the circuitry of box 60 can be generated from the netlist module for one of circuit blocks 52, provided that the outputs of that block are rearranged so that they connect to that block's inputs, rather than the inputs of the next block in the row.

Figure 7:
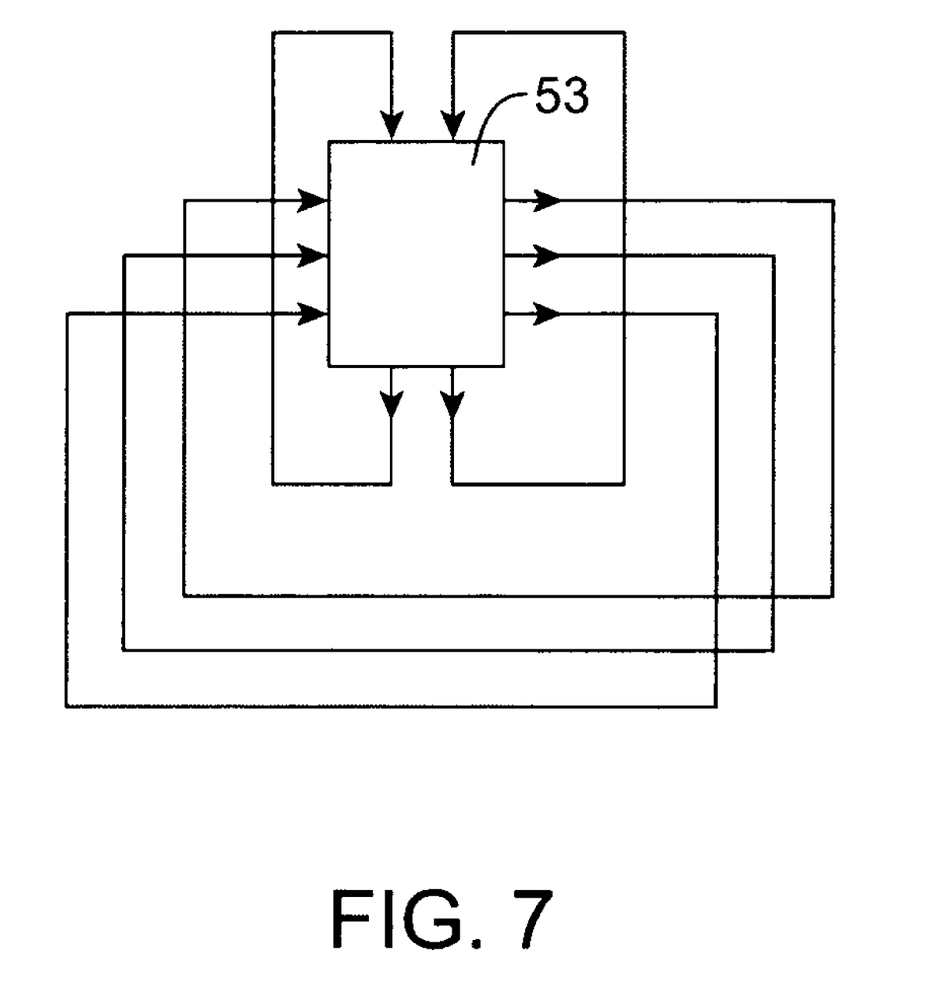
FIG. 7 is a diagram showing how the connectivity of a circuit module may be altered to facilitate block-level test data generation operations in accordance with the present invention.

The way in which this rearrangement of connections takes place when a block has outputs along more than one dimension is shown in FIG. 7. In the example of FIG. 7, circuit block 53 has outputs along its right edge and lower edge. As shown schematically in FIG. 7, the ATPG tool has automatically modified the netlist description for block 53 so that the outputs of the right edge have been fed back and connected to the inputs along the left edge. Similarly, the netlist for block 53 has been modified so that the connection definitions for the outputs running along the lower edge of block 53 have been fed back to the inputs to block 53 that run along the upper edge of block 53.

Using the modified netlist description depicted schematically in FIG. 7, the ATPG tool can generate test data corresponding to a portion of the circuit under test such as box 60 of FIG. 6. After a circuit has been designed, netlist descriptions (modules) exist for each circuit block. Manual and/or automatic techniques may be used to extract the netlist module for a repeating circuit block from the netlist of the entire circuit under test. The extracted netlist may then be modified using the technique shown in FIG. 7, rather than trying to create a new netlist for the circuitry of box 60 from scratch. Creating a new netlist from scratch is not preferred, because this approach is more prone to error and requires more labor than modifying the existing netlist to feed back its outputs to its inputs.

Figure 8:
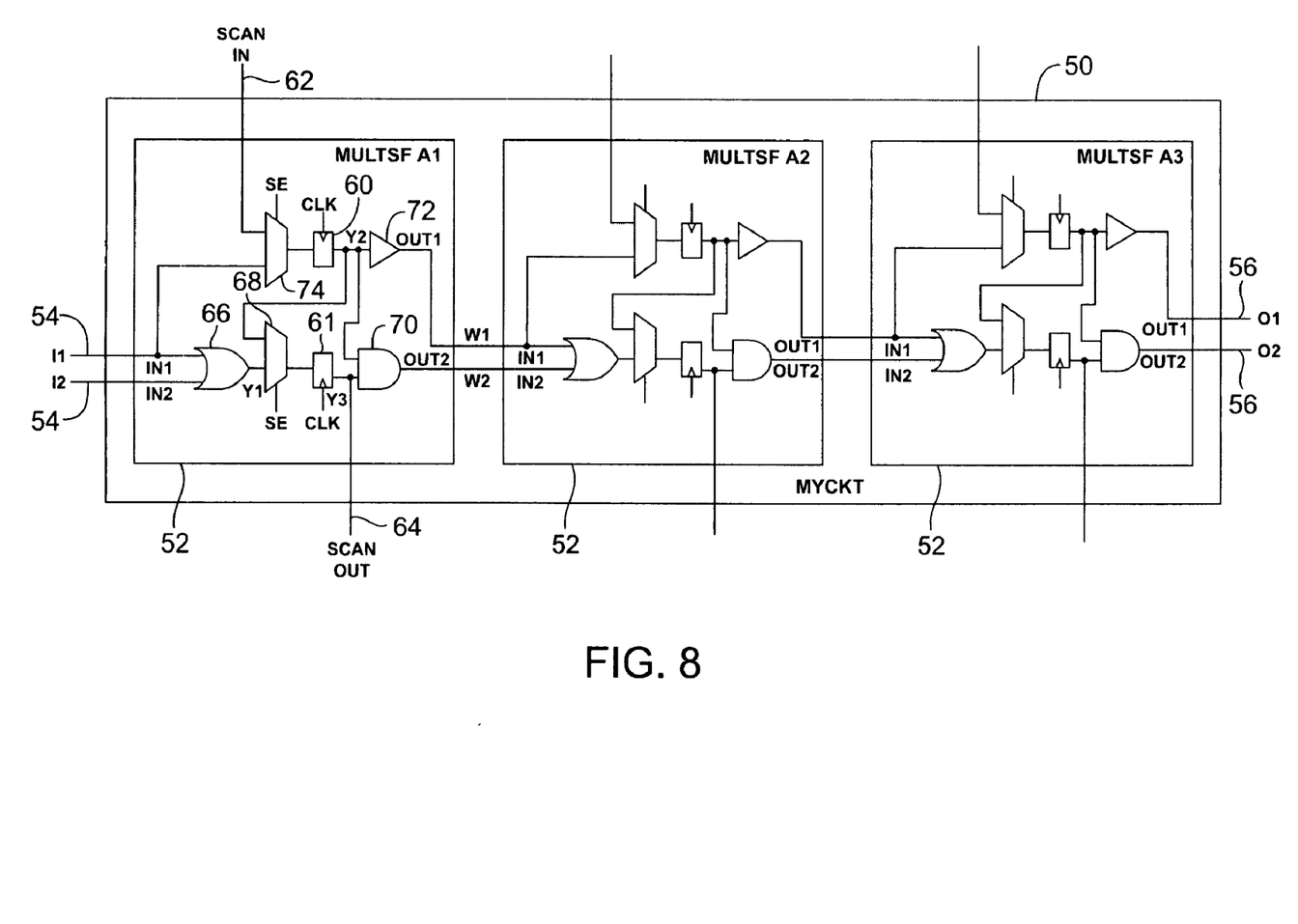
FIG. 8 is a circuit diagram of an illustrative integrated circuit to be tested in accordance with the present invention.

An illustrative integrated circuit 50 for which test data can be generated in accordance with the present invention is shown in FIG. 8. As shown in the example of FIG. 8, integrated circuit 50 contains three repeating circuit blocks 52. The inputs 54 to the first circuit block 52 serve as the inputs to the circuit 50. The outputs 56 of the last circuit block 52 serve as the outputs of the entire integrated circuit 50. The example of FIG. 8, like the example of FIG. 6, is one-dimensional. In general, however, integrated circuits have circuit blocks that extend in two dimensions (horizontal and vertical). A one-dimensional example is used to avoid over-complicating the discussion. Similarly, typical integrated circuit blocks 52 may contain thousands of logic gates, but are shown as containing only a few logic gates in the illustrative example of FIG. 8.

Each circuit block 52 contains a scan chain made up of two registers 60 and 61. Data is loaded into each scan chain at its associated scan in path 62. Data is unloaded from each scan chain at its associated scan out path 64. The registers 60 and 61 each have a clock input. The clock inputs of the registers 60 and 61 are labeled CLK in FIG. 8.

The illustrative circuitry of each circuit block 52 of FIG. 8 includes an OR gate 66, a first scan chain multiplexer 68 associated with register 61, a second scan chain multiplexer 74 associated with register 60, an AND gate 70, and a buffer 72. The netlist signal names for circuit 52 are used as labels in FIG. 8. For example, the names for the inputs to the first circuit block 52 are IN1 and IN2 in the context of the module for block 52. In the context of the module for circuit 50, these signals are called I1 and I2. Other signal paths are also labeled. For example, the output of the OR gate 66 is called "Y1". The output of the register 61 is "Y3". The output of register 60 is Y2. The outputs of buffer 72 and AND gate 70 are OUT1 and OUT2, respectively, in the context of block 52. In the context of circuit 50, the outputs of the first block 52 are W1 and W2, as shown in FIG. 8.

The netlist name for the module corresponding to the leftmost circuit block 52 in FIG. 8 is called MULTSF A1. The other two blocks 52 are called MULTSF A2 and MULTSF A3. The netlist for the entire circuit 50 is contained in the module MYCKT. Netlists can be written in any suitable language such as Verilog.

Figure 9:
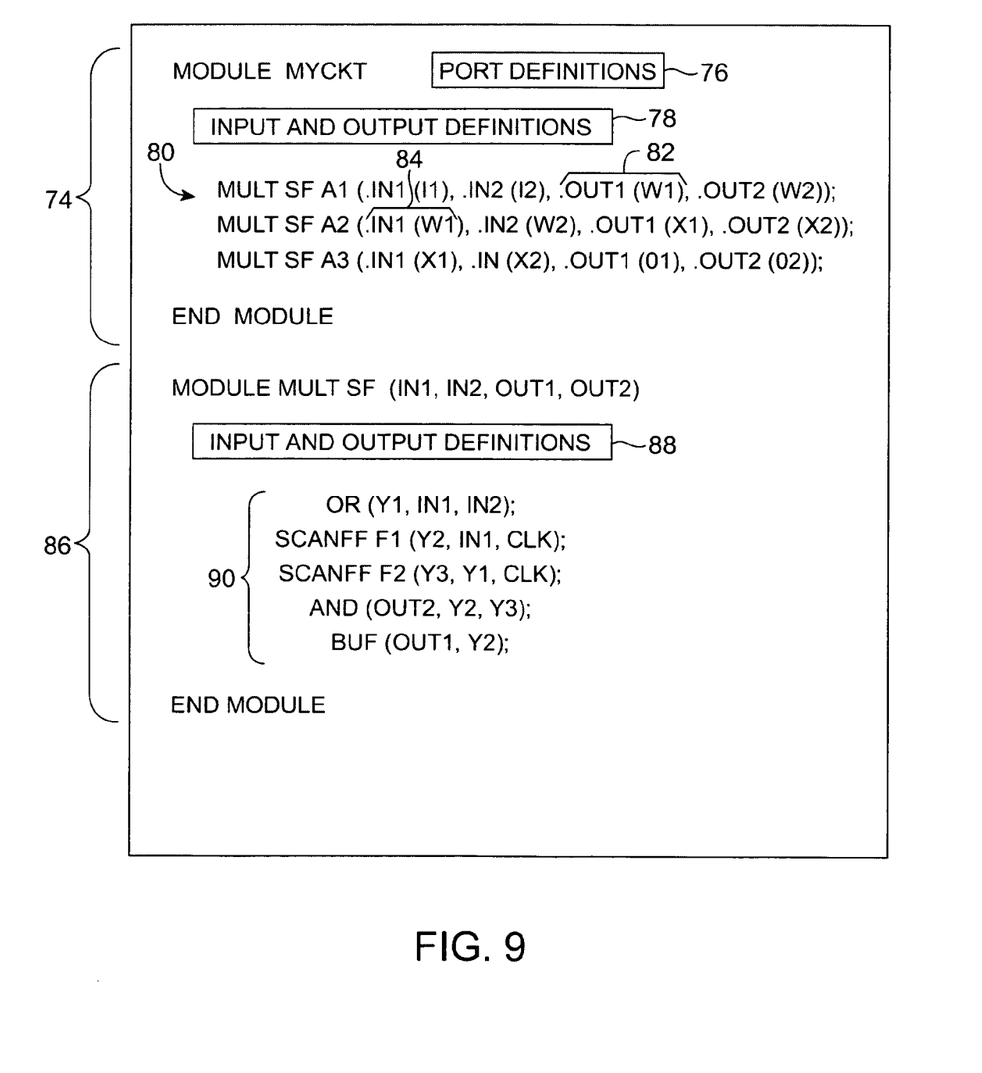
FIG. 9 is an illustrative netlist description of the circuit of FIG. 8 in accordance with the present invention.

An illustrative netlist representation of the MYCKT and MULTSF circuitry is shown in FIG. 9. As shown in FIG. 9, the MYCKT module 74 includes port definitions 76 and input and output definitions 78. In region 80, there are three instances of the MULTSF module—MULTSF A1, MULTSF A2, and MULTSF A3, each having a different set of connections. The connections are given by the parameters in brackets following each module name. For example, the text at reference numeral 82 indicates that OUT1 of block MULTSF A1 is connected to line W1, as shown in FIG. 8. The text at reference numeral 84 indicates that input IN1 in block MULTSF A2 is also connected to W1.

The existence of the three separate instances of the MULTSF module in region 80 (each with a different signal path connectivity) demonstrates that module MULTSF is a repeating module and corresponds to an identical repeating circuit block. The generic netlist definition for the MULTSF module is shown in region 86. The netlist definition of region 86 is applied to each instance of the MULTSF module in region 80.

Module 86 contains input and output definitions 88. In region 90, module 86 contains circuit definitions for each of the circuit components in block 52 of FIG. 8. As shown in region 90, the OR circuit of block 52 maps inputs IN1 and IN2 to output Y1. The SCANFF function is associated with a cascaded multiplexer and register arrangement. The first instance of SCANFF (i.e., SCANFF F1) corresponds to multiplexer 74 and register 60 of FIG. 8. The second instance of SCANFF (i.e., SCANFF F2) corresponds to multiplexer 68 and register 61. The AND module defines the operation of AND gate 70. The module BUF in region 90 defines the operation of buffer 72 of FIG. 8.

Figure 10:
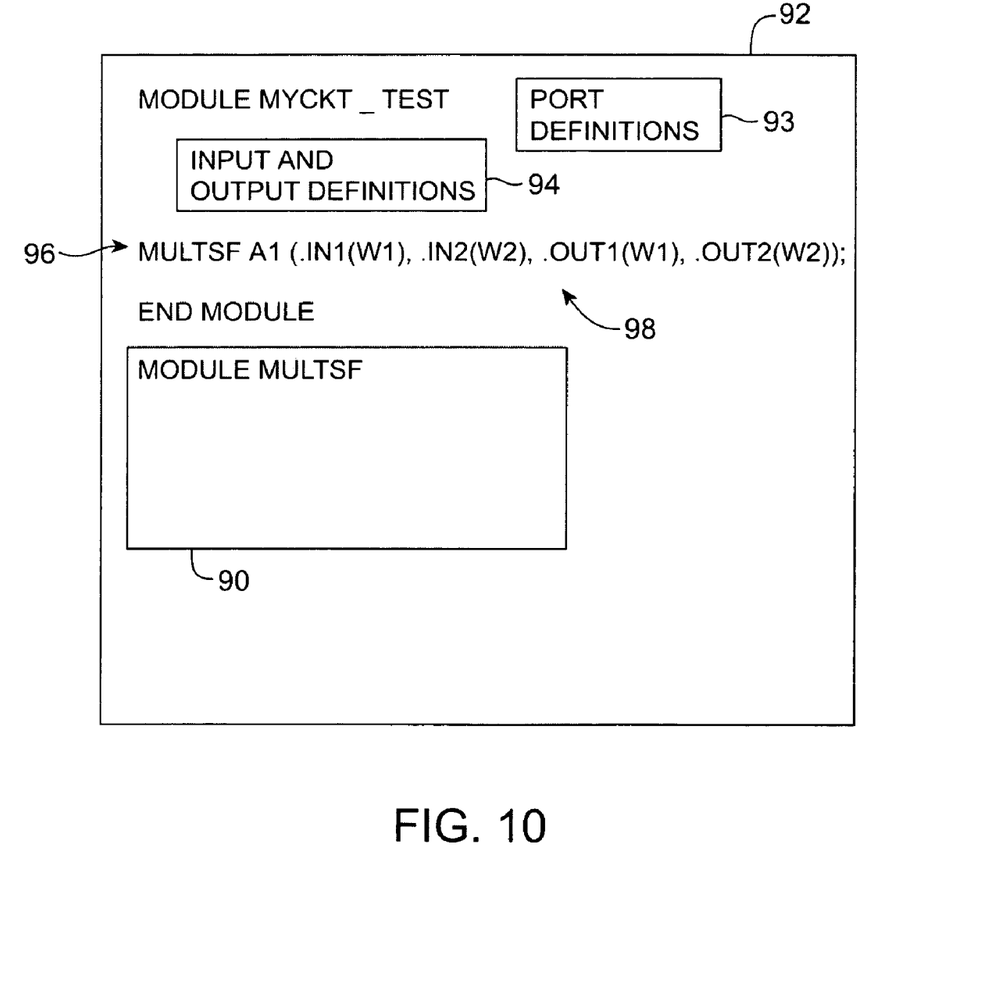
FIG. 10 is an illustrative test netlist generated based on the repeating netlist module in the netlist of FIG. 9 to be used in generating block-level test data for an integrated circuit in accordance with the present invention.

During the test data generation process, the connectivity defined by the MULTSF module of region 86 is changed to provide feedback paths of the type shown in FIG. 7. The conversion process involves converting the original netlist of FIG. 9 into the test netlist 92 of FIG. 10. As shown in FIG. 10, test netlist 92 (module MYCKT_TEST) has port definitions 93 and input and output definitions 94. The test netlist 92 also contains an unaltered copy 90 of the module MULTSF.

Rather than containing multiple instances of the repeating circuit module MULTSF as shown in region 80 of FIG. 9, the test netlist 92 contains a single instance 96 of the module. As shown in region 98, the instance of the module 96 that is contained in the test netlist 92 has a remapped version of the inputs and outputs in which each output has been fed back to an appropriate corresponding input, rather than being connected to the inputs and outputs of adjacent modules. The test netlist 92 may be used by the ATPG tool to generate block-level test data for the associated block-level circuitry (e.g., circuitry such as circuitry 60 of FIG. 6). This block-level test data can then be aggregated to form the test data for testing the entire circuit 50.

Sometimes integrated circuits to be tested contain repeating blocks of circuitry that contain combinatorial paths. Circuit designs with these combinatorial paths are relatively rare, because such paths are associated with long conductors on the integrated circuit, which tend to exhibit large capacitances and slow switching times. Nevertheless, if combinatorial loops would be formed when remapping the connections of the circuit block as shown in FIG. 7, test registers may be added to the integrated circuit to permit testing. Without adding the test registers, the signals on the combinatorial path would not be observable.

Figure 11:
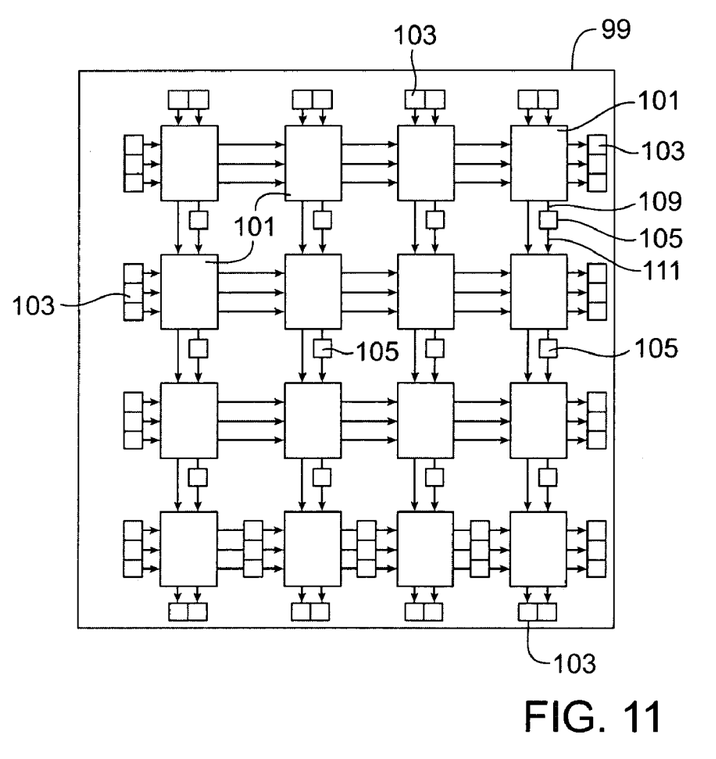
FIG. 11 is a diagram of an illustrative integrated circuit having additional test registers in accordance with the present invention to facilitate testing of circuit blocks containing unregistered paths that could form combinatorial loops.

An illustrative integrated circuit 99 that contains repeating circuit blocks 101 with combinatorial paths between their inputs and outputs is shown in FIG. 11. Boundary scan registers 103 facilitate the application of test input signals to the circuitry of blocks 101 and the capture of resulting output signals from the circuitry of blocks 101 during testing. The repeating circuit blocks 101 of circuit 99 each contain a combinatorial path between a respective input and output. Accordingly, test registers 105 have been incorporated into the integrated circuit 99 to prevent the formation of combinatorial loops when the feedback paths of FIG. 7 are formed during netlist processing.

Figure 12:
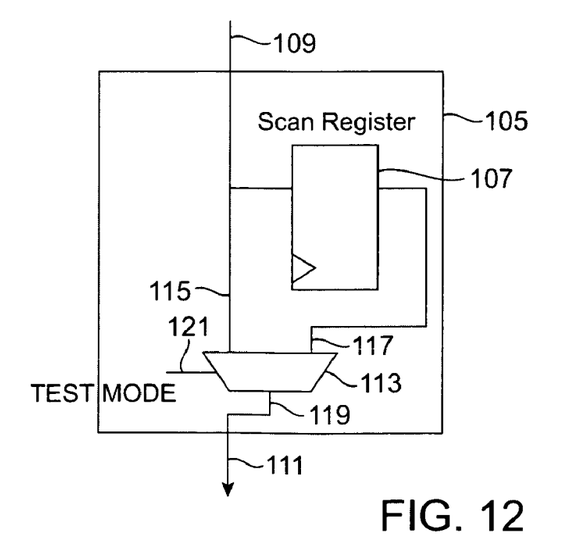
FIG. 12 is a diagram of an illustrative test register circuit that may be used to break combinatorial loops in circuits of the types shown in FIG. 11 in accordance with the present invention.

FIG. 12 is a circuit schematic diagram showing the components of an illustrative test register 105. As shown in FIG. 12, test register 105 includes an input 109 and an output 111. Input 109 is connected to the combinatorial output of a corresponding circuit block 101 (FIG. 11). Output 111 is connected to the input of an adjacent block 101 (FIG. 11). The TESTMODE signal applied to control input 121 of testmode multiplexer 113 controls whether input 115 of multiplexer 113 or input 117 of multiplexer 113 is connected to output 119. During normal operation, TESTMODE is low and signals are directed to pass from input 109 to output 111 through multiplexer 113. During testing, TESTMODE is high and signals pass from input 109 to output 111 through scan register 107.

The registers 107 on circuit 99 contain scan chain multiplexers and are chained together to form a scan chain. When the scan chain is switched off, signals are passed into the register portion of scan register 107 and are stored. When the scan chain is enabled, the signals captured in the registers 107 can be unloaded from the circuit 99.

Figure 13:
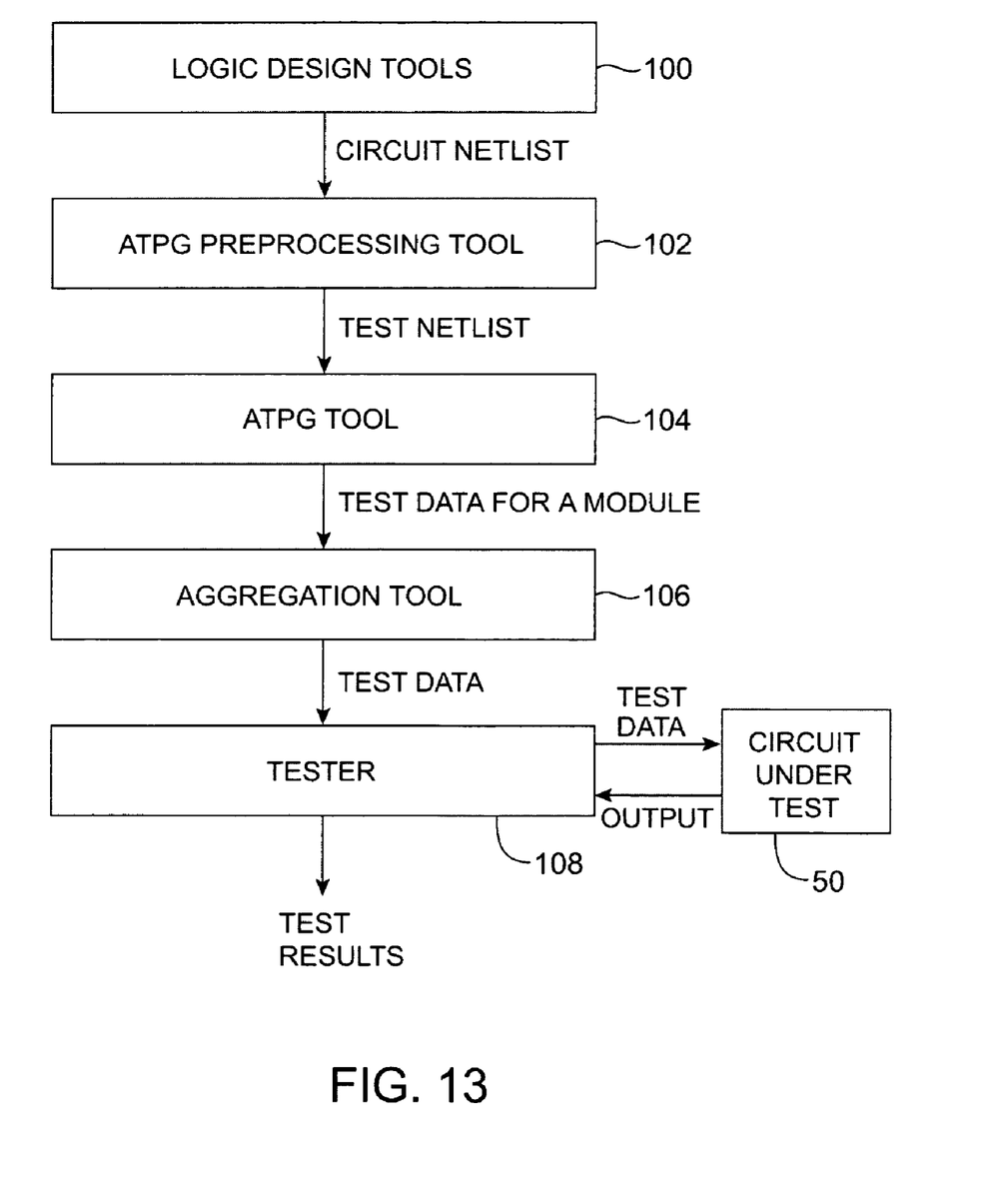
FIG. 13 is a diagram showing illustrative tools that may be used to generate and use test data to evaluate the performance of an integrated circuit containing repetitive blocks of circuitry in accordance with the present invention.

FIG. 13 shows tools used in connection with generating and using test data to test an integrated circuit containing multiple identical circuit blocks.

Initially, computer-aided design (CAD) tools 100 are used to assist logic designers in designing the integrated circuit. The CAD tools 100 may be a suite of tools associated with a particular brand of logic design system. Using the CAD tools, the logic designer (e.g., a team of circuit design engineers), produces a circuit netlist that describes the components and connectivity of the integrated circuit. The netlist is used to fabricate the integrated circuit (e.g., at a semiconductor manufacturing facility).

The circuit netlist is also provided to ATPG preprocessing tool 102. Preprocessing tool 102 may be provided as part of an ATPG tool, as part of a suite of ATPG tools, as a stand-alone software component, as an ATPG tool plug-in, or using any other suitable arrangement.

Preprocessing tool 102 performs the netlist conversion function described in connection with FIGS. 9 and 10. In particular, tool 102 processes the original netlist description of the integrated circuit such as the netlist of FIG. 9 and converts this netlist into a test netlist in which the multiple instances of the repeating circuit block 52 have been replaced by a single generic version of the circuit block and in which the connectivity associated with the block has been changed to form the feedback paths of the type shown in FIG. 7.

The test netlist produced by ATPG preprocessing tool 102 is provided to ATPG tool 104. ATPG tool 104 may be any suitable automatic test pattern generation tool for producing test data from netlist circuit descriptions. An example of a commercially available ATPG tool is the TetraMAX tool available from Synopsys. The ATPG tool performs the functions described in connection with FIGS. 1 and 2, processing the test netlist to produce test data that will allow a tester to efficiently and thoroughly test the circuitry of the test netlist. The input to the ATPG tool 104 is the test netlist describing the repeating circuit block 52. The output of the ATPG tool 104 is corresponding block-level test data that can be used to test the circuitry of the circuit block.

The test data produced by ATPG tool covers a single circuit block 52. There are generally numerous such circuit blocks 52 in the integrated circuit to be tested. Aggregation tool 106 is therefore used to form a complete set of test data for the entire integrated circuit. Tool 106 uses information on the overall architecture of the integrated circuit (e.g., netlist information provided in the circuit netlist produced by tools 100) to determine how to use the test data from the individual module into a complete set of test data suitable for testing the entire integrated circuit. The complete set of test data is provided to tester 108. Tool 106 may be provided as part of ATPG tool 104, as a separate stand-alone software component, as a plugin, etc.

Tester 108 is electrically connected to the circuit under test 50. The circuit under test may be a packaged or unpackaged integrated circuit die. The tester may include a receptacle into which a packaged integrated circuit may be inserted for testing and/or a probe head for probing the surface of a wafer containing multiple unpackaged integrated circuits.

Tester 108 provides the test data to the circuit 50 (e.g., to appropriate boundary scan registers and other scan chain registers) and captures the resulting output of the circuit 50 (e.g., in appropriate boundary scan registers and other scan chain registers). The output signals from circuit 50 are processed by tester 108 to determine whether the circuit 50 is responding to the test inputs as predicted by the ATPG tool 104. If the circuit 50 responds as expected, the test results produced by the tester will indicate that the circuit 50 has passed the test.

Figure 14:
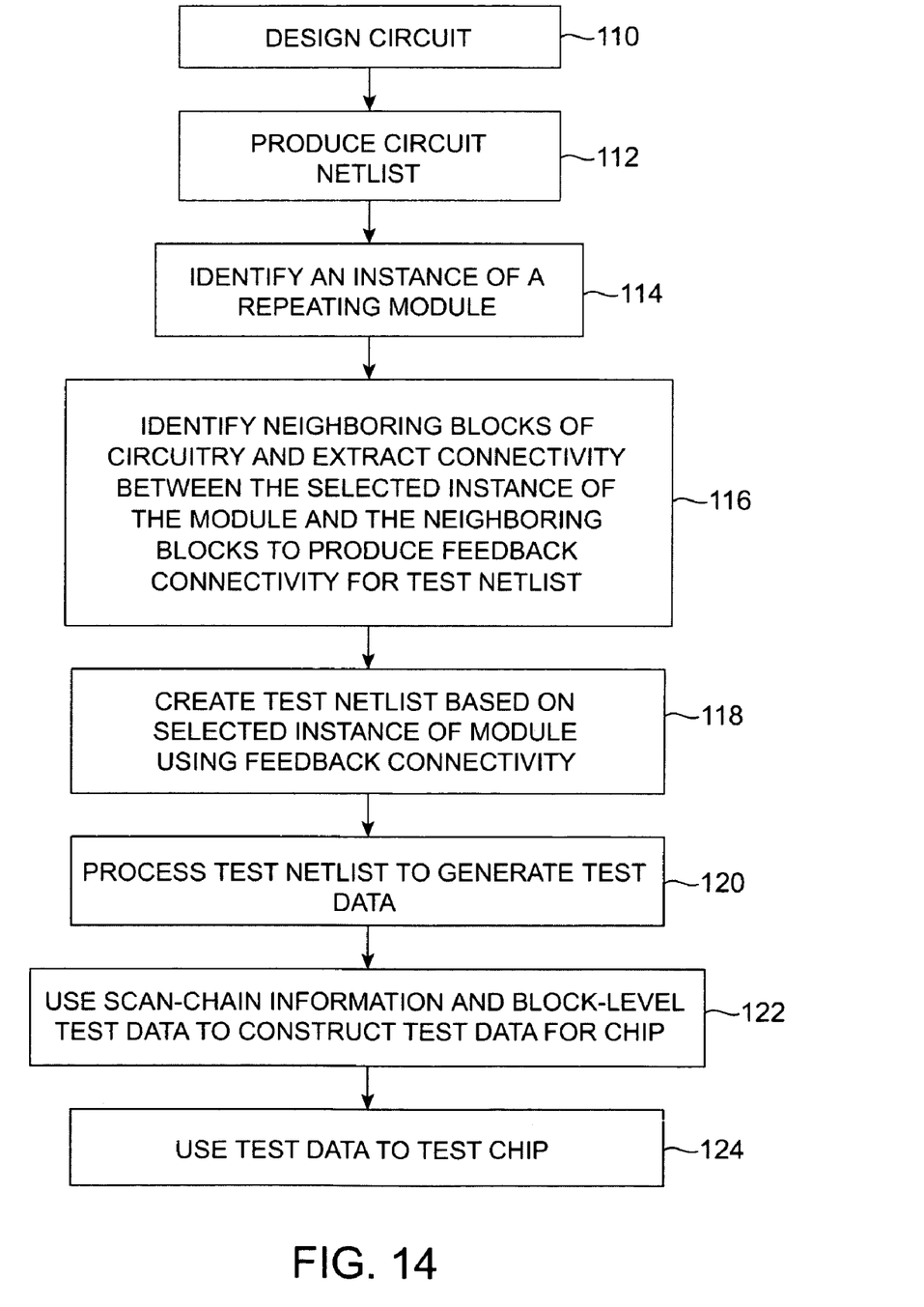
FIG. 14 is a flow chart of illustrative steps involved in using the tools of FIG. 13 to generate test data for testing integrated circuits with repeating circuit blocks in accordance with the present invention.

Illustrative steps involved in using the tools of FIG. 13 in designing and testing a circuit are shown in FIG. 14.

At step 110, a logic designer uses CAD tools 100 (FIG. 13) to design an integrated circuit. The integrated circuit design is implemented as an integrated circuit device (e.g., by fabricating the integrated circuit chip using semiconductor fabrication manufacturing techniques).

As part of the design process, the logic designer uses CAD tools 100 to produce a circuit netlist description of the integrated circuit design (step 112).

At step 114, an instance of an appropriate repeating module in the circuit netlist for the integrated circuit is identified. The module has multiple instances, as shown in the MULTSF A1, A2, and A3 example of FIG. 9. Each instance of the repeating module corresponds to a separate identical circuit block 52 in the fabricated integrated circuit. The identical modules can be identified manually (e.g., a logic designer can manually examine the netlist for repeating modules) or automatically (e.g., a tools such as tool 102 of FIG. 13 can extract the repeating module from the netlist).

After identifying an instance of a repeating module in the circuit netlist, the ATPG preprocessing tool 102 automatically identifies neighboring circuit blocks 52 at step 116. For example, in an architecture containing a two-dimensional grid of identical circuit blocks each of which has inputs along its upper edge and along is left edge, the tool 102 can automatically identify the circuit block immediately to the right of the block and the circuit block immediately below the block as being neighboring blocks that receive signals from the selected module. These blocks (e.g., the right-hand block and lower block in this example), normally receive inputs from the identified instance of the repeating module. During step 116, the ATPG preprocessing tool 102 automatically extracts the connectivity between the selected instance of the repeating module and the neighboring blocks and uses the extracted connectivity to produce feedback connectivity information for a feedback arrangement of the type shown in FIG. 7.

At step 118, the ATPG preprocessing tool 102 creates a test netlist using the selected instance of the module and the extracted feedback connectivity from step 116.

After extracting the netlist for one of the repeating identical blocks and altering the connectivity in this extracted netlist to produce a test netlist with a feedback arrangement of the type shown in FIG. 7, the ATPG tool can process the test netlist at step 120. During processing of the test netlist at step 120, the ATPG tool 104 generates block-level test data suitable for thoroughly testing the circuitry of the single module identified at step 114.

At step 122, aggregation tool 106 uses information on the scan chain connectivity of all of the circuit blocks on the integrated circuit from the circuit netlist to construct a global set of test data suitable for testing the entire integrated circuit. During step 122, the aggregation tool 106 constructs the global test data by combining a suitable number of copies the block-level test data from step 120 into a unitary test data set. The information from the circuit netlist on how the scan chains of each block are interconnected is used to combine the block-level test data copies properly.

At step 124, the tester 108 (FIG. 13) uses the global test data to test the integrated circuit.

The tools of FIG. 13 may be implemented by loading and running software on computers. The computers may be dedicated computers that have been optimized for their intended function (e.g., testing, etc.) or may be general purpose computers (e.g., personal computers, workstations, mainframes). Each tool may be implemented on a single computer or on a group of more than one computer (e.g., a cluster of servers connected to a local area network).

These various computer-based systems include processing circuitry and storage media (memory). The storage media may include internal and external hard disks, read-only memory, random-access memory (RAM), flash memory and other non-volatile memory chips, removable media such as removable disks, and other suitable storage devices. The processing circuitry and storage are used to store and execute data to support the operations described in connection with FIGS. 13 and 14.

During operation of the tools of FIG. 13, executable software runs on the processors of the computers. Databases in the storage of the computers are used to store data for the operation of the tools of FIG. 13. In general, software may be stored on any computer-readable medium (storage). When the software of the tools is installed, the processing circuitry and storage of the tools have instructions and data that cause the computing equipment in the tools to execute various methods (processes). When performing these processes, the computing equipment is configured to implement the functions of the tools that are described in connection with FIGS. 13 and 14.

The foregoing is merely illustrative of the principles of this invention and various modifications can be made by those skilled in the art without departing from the scope and spirit of the invention.

What is claimed is:

1. A computer-implemented method for generating test data for testing an integrated circuit, wherein the integrated circuit has a design that is represented by a circuit netlist containing a plurality of identical netlist modules, and wherein each of the identical netlist modules has inputs and outputs connected to other identical netlist modules, the method comprising:

using a computer-implemented tool to create a test netlist in storage for a given one of the identical netlist modules by automatically altering a given one of the identical netlist modules so that its outputs are connected to its inputs and form feedback paths; and using an automatic test pattern generation tool to process the test netlist to generate the test data in a computer-readable storage medium for testing the integrated circuit.

2. The computer-implemented method defined in claim 1 wherein using the automatic test pattern generation tool to process the test netlist comprises producing block-level test data for testing one of a plurality of identical circuit blocks on the integrated circuit, wherein each of the identical circuit blocks is described by a corresponding one of the identical netlist modules.

3. The computer-implemented method defined in claim 1 wherein using the automatic test pattern generation tool to process the test netlist comprises producing test data for testing one of a plurality of identical circuit blocks on the integrated circuit, wherein each of the identical circuit blocks is described by a corresponding one of the identical netlist modules, the method comprising:

using scan chain information and the test data produced from the test netlist to construct the test data for testing the integrated circuit.

4. The computer-implemented method defined in claim 1 further comprising using an aggregation tool to combine multiple copies of the test data into a global set of test data for testing the integrated circuit.

5. The computer-implemented method defined in claim 1 wherein the identical netlist modules in the circuit netlist comprise multiple instances of a module, the method further comprising:

identifying an instance of the module to use as the given one of the identical netlist modules in creating the test netlist.

6. The computer-implemented method defined in claim 1 wherein the identical netlist modules in the circuit netlist comprise multiple instances of a module, the method further comprising:

using an automatic test pattern generator preprocessing tool to identify an instance of the module to use as the given one of the identical netlist modules in creating the test netlist.

7. The computer-implemented method defined in claim 1 wherein the identical netlist modules in the circuit netlist comprise multiple instances of a module, the method further comprising:

identifying an instance of the module to use as the given one of the identical netlist modules in creating the test netlist; and extracting connectivity between the identified instance of the module and neighboring modules to produce feedback connectivity to use in forming the feedback paths.

8. A computer-implemented method for generating test data for testing an integrated circuit, wherein the integrated circuit has a design that is represented by a circuit netlist containing a plurality of identical netlist modules, and wherein each of the identical netlist modules has inputs and outputs connected to other identical netlist modules, the method comprising:

using a computer-implemented tool to create a test netlist for a given one of the identical netlist modules by automatically altering a given one of the identical netlist modules so that its outputs are connected to its inputs and form feedback paths;

using an automatic test pattern generation tool to process the test netlist to generate the test data for testing the integrated circuit; and using a tester to apply the test data to scan chain registers in the integrated circuit.

9. The computer-implemented method defined in claim 1 wherein each of the identical netlist modules in the circuit netlist corresponds to an identical block of circuitry on the integrated circuit that contains a respective scan chain, wherein each scan chain contains a plurality of scan chain registers, the method further comprising:

using a tester to apply the test data to the scan chain registers of each of the identical blocks of circuitry.

10. Software on a computer-readable storage media used for generating test data for testing an integrated circuit, wherein the integrated circuit has a design that is represented by a circuit netlist containing a plurality of identical netlist modules, and wherein each of the identical netlist modules has inputs and outputs connected to other identical netlist modules, comprising:

code for creating a test netlist in storage from a given one of the identical netlist modules by automatically altering that given one of the identical netlist modules so that its outputs are connected to its inputs and form feedback paths; and code for processing the test netlist using an automatic test pattern generation tool to generate the test data in a computer-readable storage medium for testing the integrated circuit.

11. The software defined in claim 10 wherein the code for processing the test netlist comprises:

code for processing the test netlist to generate block-level test data, wherein the block-level test data corresponds to test data for testing a block of circuitry in the integrated circuit, wherein the block of circuitry corresponds to one of a plurality of identical blocks of circuitry, and wherein each of the identical blocks of circuitry is defined by a corresponding one of the identical netlist modules.

12. The software defined in claim 10 wherein the code for processing the test netlist comprises:

code for processing the test netlist to generate block-level test data, wherein the block-level test data corresponds to test data for testing a block of circuitry in the integrated circuit, wherein the block of circuitry corresponds to one of a plurality of identical blocks of circuitry, and wherein each of the identical blocks of circuitry is defined by a corresponding one of the identical netlist modules; and     code for creating test data for the integrated circuit based on the block-level test data.

13. The software defined in claim 10 wherein the code for processing the test netlist comprises:

code for processing the test netlist to generate block-level test data, wherein the block-level test data corresponds to test data for testing a block of circuitry in the integrated circuit, wherein the block of circuitry corresponds to one of a plurality of identical blocks of circuitry, and wherein each of the identical blocks of circuitry is defined by a corresponding one of the identical netlist modules; and     code for creating test data for the integrated circuit based on the block-level test data and based on scan-chain information for the integrated circuit.

\* \* \* \* \*